United States Patent [19]

Scholz

[11] Patent Number: 4,584,700

[45] Date of Patent: Apr. 22, 1986

[54] ELECTRONIC AUDIO SIGNAL PROCESSOR

[76] Inventor: Donald T. Scholz, 13 Rich Valley Rd., Wayland, Mass. 01778

[21] Appl. No.: 420,280

[22] Filed: Sep. 20, 1982

[51] Int. Cl.⁴ .............................................. H03G 3/00

[52] U.S. Cl. ........................................ 381/61; 381/98

[58] Field of Search .................. 381/61, 98, 101, 102, 381/103, 104, 106, 118; 84/DIG. 9; 333/14, 17 L

[56] References Cited

U.S. PATENT DOCUMENTS

| | | | |
|---|---|---|---|
| 2,037,285 | 4/1936 | Tasker | 381/103 |
| 3,304,369 | 2/1967 | Dreyfus | 381/106 X |
| 4,146,745 | 3/1979 | Froeschle | 381/103 X |
| 4,180,707 | 12/1979 | Moog | 381/61 |
| 4,211,893 | 7/1980 | Smith | 381/118 X |
| 4,363,006 | 12/1982 | Ishigaki et al. | 381/106 X |
| 4,363,007 | 12/1982 | Haramoto et al. | 381/106 X |
| 4,368,435 | 1/1983 | Bloy | 381/98 X |
| 4,400,583 | 8/1983 | Bloy | 381/98 |
| 4,412,100 | 10/1983 | Orban | 381/106 X |

OTHER PUBLICATIONS

H. Tremaine, *Audio Cyclopedia,* H. Sams Co., 1969; pp. 937–939.

*Electronics Today International,* vol. 8, No. 10, Oct. 1979, pp. 47–49; "Audio Compressor".

*Primary Examiner*—Keith E. George
*Attorney, Agent, or Firm*—Wolf, Greenfield & Sacks

[57] ABSTRACT

An electronic audio signal processor especially suitable for electrical instruments such as electric guitars is provided including a controlled distortion and tone alteration portion and a reverb portion. The controlled distortion and tone alternation portion in one form comprises in cascade a compression stage which compresses the amplitude level of an inputted audio signal, a mid band pass filter, a distortion amplifier for adding controlled distortion to said signal and a complex filter having a roll-off of increased attenuation with increased frequency range in the lower and upper audio frequency ranges, and a generally flat response in the middle audio frequency range except with a dip followed by a peak in the upper portion of the mid audio frequency range. The reverb circuit includes a synthetic doubler which provides an output cyclicly varying in pitch from its input and a stereo analog shift register reverb device having two summers which combine staggered adjacent output lines from an analog shift register in different combinations. Two output mixers in conjunction with a switch provide reverb alone, doubling alone or reverb with doubling.

21 Claims, 5 Drawing Figures

ELECTRONIC AUDIO SIGNAL PROCESSOR

TECHNICAL FIELD

This invention is directed to devices which alter the electrical audio signals, and more particularly to devices for producing controlled distortion in audio output signals and for enhancing the tonal quality thereof.

BACKGROUND OF THE INVENTION

There are many prior art devices available which alter the tonal quality of electrical audio signals. For example, one prior art device has a distortion generator or a distortion compressor stage followed by a filter with a roll-off or attenuation with increased frequency, along with means to adjust either the amount (steepness) of the roll-off, or the point (knee) of the roll-off. However, the filter in such a device is very crude. Further the adjustment means requires the operator to experiment with different settings or combinations of settings in order to define a desirable sound, and even then the device is limited in the quality of sound which it is capable of producing. Moreover, the arrangement just described does little if anything to tailor or enhance the character or quality of the tone of the signal produced by the distortion generator or compressor stage.

Many prior art devices are available for electrically introducing reverberation effects into an audio electrical signal. Many of these devices are susceptible to mechanical jarring, and produce "Boing" type sounds when subject to such jarring or mechanical vibration and from short transient sounds. At least one prior art reverb unit incorporates a multiple output bucket brigade device, i.e. analog shift register. However, for certain applications this device does not provide sufficient delay of the inputted signal, produces undesireable echo with pulse inputs, and is limited in the type and quality of the reverb that it provides.

SUMMARY OF THE INVENTION

An object of the invention is to add controlled distortion to an audio signal to change the dynamics or sustain characteristics of an audio signal, and to alter the tonal quality of the audio signal.

A further object of the invention is to add reverberation to an audio signal such that the resultant signal has superior reverberation characteristics.

In accordance with the present invention, different combinations of filters and other devices are connected serially in different chains. In one form of the invention, a mid band pass filter receives an electrical audio input signal and provides the output to a distortion amplifier which receives the output of the mid band pass filter and adds higher harmonic audio signals to the received signal, compresses it further, and alters the waveform. A complex filter receives the output of the distortion amplifier and provides an output signal having enhanced tonal qualities. The complex filter has a roll-off of increased attentuation with increased frequency range, a boost in the low frequency range, a dip in the upper portion of the low frequency range, a dip in the mid audio frequency range, a dip followed by a peak in the upper frequency portion of the mid audio frequency range, followed by a roll-off of increased attenuation with increased frequency in the upper audio frequency range.

In another form of the invention, a high pass audio filtering circuit receives an electrical audio input signal and provides an output signal to a compressor circuit which produces an output signal having increased sustain. A complex filter with characteristics as described above may be provided after the compressor circuit.

In another form of the invention, a compressor circuit receives an audio signal and produces an output signal having increased sustain, a mid pass filter receives this signal, and the filtered signal is provided to a distortion amplifier which adds more compression and higher audio harmonic signals. A complex filter, having characteristics as described above, may be provided after the distortion amplifier.

In one form of the invention for providing reverberation, a timed turn on gate receives a main audio signal and gates this signal to an analog shift register device only after this signal exceeds a certain signal level for a certain time period. The analog shift register provides delayed output signals at a plurality of staggered delay taps. At least one summing device receives the output signals at several delay taps and outputs a signal having reverb characteristics or delay ("echo") components. By providing a timed turn on gate in front of the analog shift register, much unwanted noise of short duration and transient peaks at the start of notes are removed and therefore an output signal having higher quality reverberation is obtained.

In another form of the invention for providing reverberation to an audio signal, an analog shift register receives a main audio signal and provides delayed outputs at a plurality of staggered delay taps. An output delay circuit receives an output signal from one of the staggered delayed taps, preferably the last in the series, and delays the received signal a time period substantially different from the delay time period between any two of the adjacent staggered delay taps. Two summing devices receive output signals from the delay taps, and one of the summing devices receives the output from the output delay circuit. By summing the signals inputted thereto, the summing devices provide two different channels of audio output signals having different delay components. The output delay circuit following the analog shift register provides additional reverberation components to the resultant output signal, which is different from the sound obtained by using a single analog shift register.

Numerous other advantages and features of the present invention will become readily apparent from the following detailed description of the invention and one embodiment thereof, from the claims and from the accompanying drawings.

DETAILED DESCRIPTION OF THE PREFERRED EMBODIMENT

Figure 1:
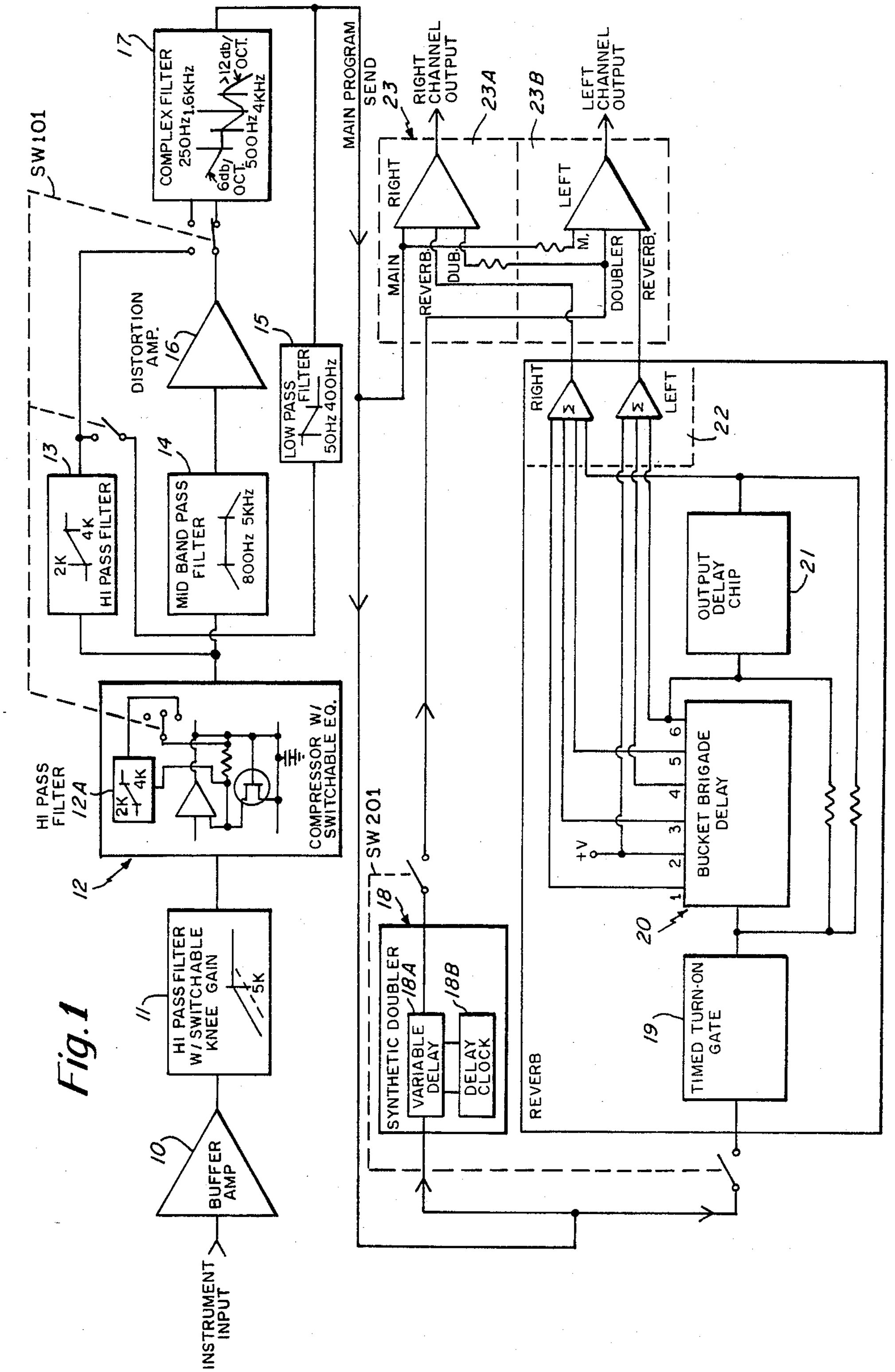
FIG. 1 is an overall block diagram of the electronic audio signal processor according to the invention.

While this invention is susceptible of embodiment in many different forms, there is shown in the drawings and will herein be described in detail one specific embodiment with the understanding that the present disclosure is to be considered as an exemplification of the principles of the invention and is not intended to limit the invention to the embodiment illustrated. While the description of the preferred embodiment may at times refer to audio signals from musical instruments such as electric guitars, it is to be understood that application of the invention is not limited to musical instruments or electric guitars.

As used herein, the term "low" when used in conjunction with low pass filters and the like is intended to refer to a range starting at about 50 Hz and ending at about 250 Hz to 800 Hz. In the same context, the word "middle" or "mid" is intended to refer to the range starting at about 250 Hz to 800 Hz and ending at about 2 KHz to 5 KHz. Lastly, the word "high" is intended to refer to the range starting about 2 KHz to 5 KHz and ending somewhere in the upper audio frequency spectrum.

The compressor as described herein is intended to refer to a device which compresses the intensity range of the output signal as compared to the range of the input signal, and more particularly to a device which amplifies weak signals and attenuates strong signals to produce a smaller output range for a given input range. The distortion amplifier is intended to refer to a device which functions as a linear amplifier up to a certain point of input signal level and then clips above that certain level in order to produce controlled distortion. In the preferred embodiment, the distortion amp functions to cause intermodulation of the input signals and to produce high harmonics of the low range and mid range audio content of the input signal, generally independently of the high range content of the input signal. The doubler (synthetic doubler) produces an output signal which varies in pitch from its input signal, so that its output signal simulates an instrument different from the instrument providing the input signal. When the output of the doubler is combined with the input by a summer or mixer the result is like two separate instruments.

For purposes of description, the preferred embodiment according to the invention has two main portions: a controlled distortion and tone alteration and sustain alteration portion, and a reverberation portion.

The portion of the preferred embodiment which is directed to controlled distortion tone alteration and sustain operates in one of four modes, as controlled by a selector switch. In each mode a different combination of filters and devices are connected serially in a chain after a buffer amp 10 and high pass filter 11 as shown in FIG. 1. The filter 11 increases the mid and some of the high range part of the input signal which decay faster, causing the compressor to react more to the mid range part of the signal than to the low range part of the signal. This allows the compressor to maintain the mid range at a more constant level as a note decays, which is more pleasing when heard directly, and is important when its output is connected to the distortion amp 16 and a complex filter 17. In the second mode, the chain consists of the compressor 12 with the high end EQ boost 12A, a high pass filter 13 and the complex filter 17. In the third mode, the chain consists of the compressor 12 without the high end EQ boost 12A, the high pass filter 13 and the complex filter 17. In the fourth mode, the chain consists of the compressor 12 without the high end EQ boost 12A, and a low boost EQ 15.

In the first operational mode, the distortion amp 16 is used for adding substantial controlled distortion. The mid band pass filter 14 reduces the high and low signal content before the signal goes through the distortion amp 16. Rolling off the highs results in less noise at the output of the distortion amp and reduces the amount of highs from the input signal heard after the distortion amp 16. This is important because in this substantial distortion mode it is important that the high end content of the output signal be made up primarily of high harmonics produced by distorting the mid range portion of the signal which are of long duration, rather than by the natural high harmonics contained in the input signal which are of short duration. Also, the high pass filter 11 is modified in this mode by opening the switch 100 which causes the filter to level off at a lowered frequency thus providing less high end content. The rolling off of the lows is important as this reduces modulation of the output signal by the low end content of the input signal. Actually, the low signal content is reduced twice; once at the high pass filter 11 after the buffer amp 10, and again at the mid band pass filter 14.

The compressor 12 receives a wide amplitude range of signals and outputs an output signal having a relatively narrow amplitude range. The compressor 12 is designed so that its output is fixed at a good level for generating harmonics within the distortion amplifier 16. Therefore, one advantage of having the compressor 12 in front of the distortion amp 16 is so that the harmonics generated by the distortion amp 16 can be controlled by the operation of the compressor 12.

The importance of the compressor 12 will be understood more readily if one considers what the resultant signal would be like without a compressor. If a distortion amplifier were to receive signals directly from a stringed musical instrument a very loud signal is produced when the string is first plucked, and a certain associated distortion characteristic will be produced. When the signal dies out or decays, the character of the signal changes dramatically. Therefore the difference in distortion outputs, with the signal increased, is very pronounced and significant.

One aspect of the invention is directed to minimizing the difference between the initial output of the distortion amplifier 16 and the subsequent sustained output of the distortion amplifier. In order to get sustain out of a musical note, a compressor 12 is used to prevent the signal from dying out or decaying as quickly and keeps the signal near a maximum output level for a certain time period. This signal is fed into the distortion amplifier 16 or distortion generator which generates harmonics.

The mid band pass filter 14 in front of the distortion amplifier 16 is fairly important in obtaining a distorted musical sound having a good waveform quality, as is the compressor 12 bipass EQ 11. The complex filter 17 which receives the output of the distortion device, processes this output into an ouput signal having excellent tonal qualities. Without this filter, the output would be both "harsh" and "muddy" in tonal quality.

In a second operational mode, the gain of an operational amplifier in the compressor stage 12 will be reduced, thereby cancelling some of the effect of the compressor unit 12 and reducing the level of the signal going into the distortion amp 16. The distortion amp 16 will not stay in the distortion state quite as long. Each time a note is played on the guitar, distortion will occur, but only for a brief time period.

The distortion amplifier 16 produces more high harmonics as the amp 16 is driven harder. Therefore, when the distortion amp 16 is not driven hard, fewer high harmonics are produced. In order to compensate for this, a high end EQ boost 12A (high pass filter) can be switched into in the compressor state 12, resulting in additional high end signal content, when this reduced gain mode is selected.

As the signal decays, the generated highs will diminish as the distortion amp 16 returns to the linear range of operation and no longer outputs a distorted signal. Since the distortion amp is no longer producing as much high end, a high end EQ boost 12A in the compressor is switched in this second mode. The high end produced will compensate for the fact that the distortion amp 16 is not producing as much high end, resulting in approximately the same amount of high signal content, but without as much distortion. This mode of operation may be desirable for guitar players who desire only a slight amount of distortion for pop music, instead of heavy rock and roll type sustained distortion.

The importance of having the high end EQ boost 12A before the distortion amp 16 can be illustrated by considering what sound would result by having a high end EQ boost after instead of before a distortion amp. Then the high harmonics synthetically generated by the distortion amp would also be amplified or boosted, and the distorted tones would be boosted, and the true guitar sounds would be masked too much by the distorted guitar tones. However, by putting a high end EQ boosst before the distortion amp 16, the boost has substantially no effect on the high harmonics that the distortion amp produces because the output of the distortion amp is more dependent on the mid range content of the signal than the high range. Therefore, it is important that the high end EQ boost 12A associated with the compressor 12 be placed in front of the distortion amp 16 when the distortion amp is driven at lowered signal levels. This output is then processed by the complex filter 17 to improve its tonal qualities.

In the third operational mode, the chain consists of the compressor 12 without the high end EQ boost 12A, a high pass filter 13 and the complex filter 17. This operational mode might be used by musicians who desire a clean sound without controlled distortion. The distortion amplifier 16 used in the first operational mode outputs a relatively large amount of high end signal content by adding high harmonics. Since the distortion amplifier is not used in this operational mode, the high pass filter 13 increases the higher harmonic content of the signal and thus compensates for the absence of the distortion amplifier 16. The complex filter 17 was designed primarily to process the output of the distortion amplifier 16 but is used in this mode to make the tone more similar to that of the first and second operational mode. The complex filter 17 functions so that its output has a relatively large amount of low end and mid range signal content and rolls off dramatically at its upper end due to the large high end signal content produced when the distortion amp is being used. However, since the distortion amplifier is not used in the third operational mode, instead of eliminating the complex filter and replacing it with a separate second complex filter for use in this second operation mode, a simpler high pass filter 13 is provided in cascade with the complex filter 17. The high pass filter 13 will compensate somewhat for the bass heavy response of the complex filter 17.

Since the complex filter 17 has a peak in the mid range at about 500 Hz with a dip at 250 Hz and 1.6 KHz, the device will process the signal from a rather toneless guitar into a signal with enhanced tonal qualities in the same way the good stringed instruments with good tonal qualities have heavy response areas in the mid range. For guitars which already have good tonal response in the mid range, some additional mid range tone will be obtained.

In the fourth operational mode, the chain consists of the compressor 12 without the high end EQ boost 12A, and a low end EQ boost 15. This operational mode omits the distortion amplifier 16 and complex filter 17 present in other operational modes, and is primarily for keyboard instruments or for jazz guitarists who want a truer sound without substantial emphasis or de-emphasis of the tonal qualities of the musical instrument. The lower end of the audio frequency spectrum is boosted by the low end lost through the high pass filter 11. However, total compensation is not achieved, since if the high pass filter 13 and low pass filter 15 are superimposed, the resultant filter would be flat from 50 to 400 Hz and then climb to about 5 KHz where it would flatten out.

Figure 2:
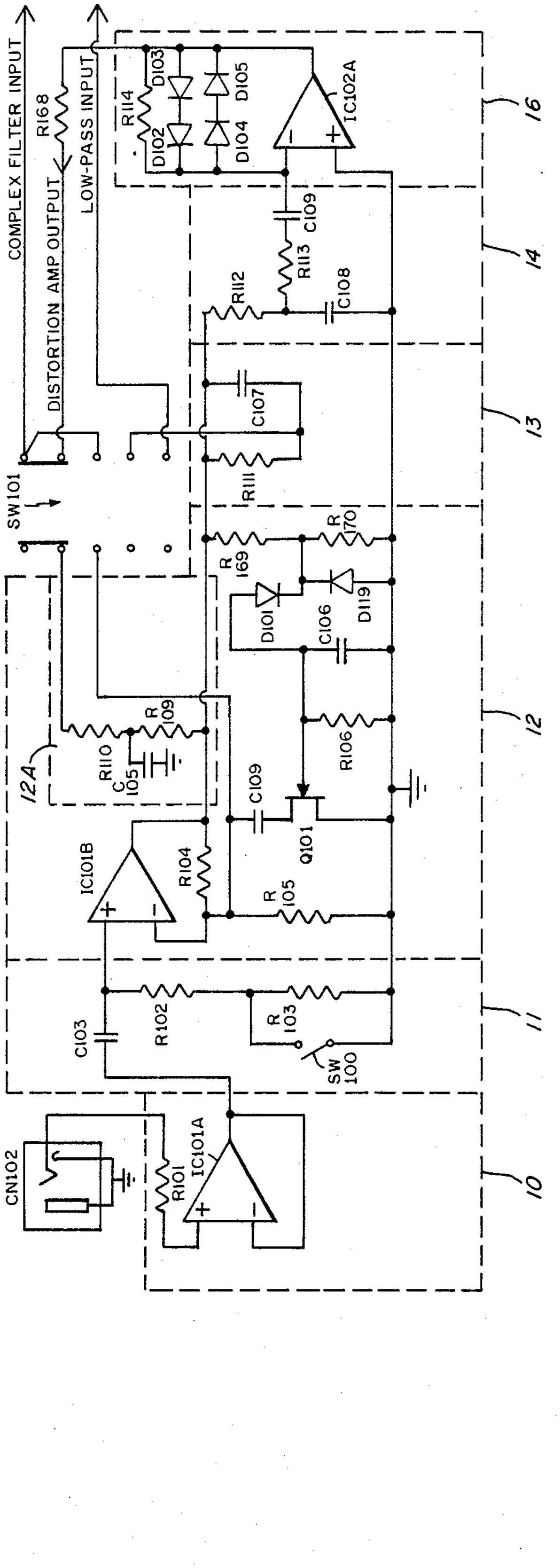
FIG. 2 is an electrical schematic of a portion of the block diagram of FIG. 1, showing the input buffer amplifier stage, the high pass filter stage, the compressor with switchable equalization, another high pass filter stage, a mid band pass filter stage and controlled distortion amplifier stage.

Referring now to FIG. 2, certain parts of the controlled distortion and tone alteration portion of the preferred embodiment will now be described in greater detail. Buffer amplifier 10 comprising integrated circuit IC 101A receives an electrical input signal from a musical instrument or any other device producing audio signals through monaural connector CN 102 and resistor R 101. The output of the buffer amplifier 10 is provided to a high pass filter circuit 11 comprising resistors R 102 and R 103, capacitor C 103 and switch SW 100.

Switch SW 100 provides a means to adjust the point of the roll-off or knee between one frequency position of about 5 KHz (for "clean" sounds) and a higher frequency position (for "distorted" sounds). The high pass filter 11 has a roll-off of increased attenuation with a decrease in frequency of about 6 db per octave. When the switch position dictates a lower knee, the gain of the mid-range is higher by about 6 db. Accordingly, with the increase in gain the large signal inputted to the op amp IC 101B will probably push it into distortion at all times. Actually SW 100 is mechanically tied to SW 101, so that SW 100 is open only when SW 101 is in its uppermost position. In this position the device operates in the first mode, i.e. with the mid band pass filter, without the high end EQ 12A in the compressor stage 12.

The output of the high pass filter 11 is provided to a compressor circuit 12. As explained above, the compressor circuit 12 amplifies weak signals and attenuates strong signals to produce a smaller amplitude range compared to the amplitude range of its input. The compressor circuit comprises essentially an amplifier IC 101B and an FET transistor Q 101 which serves to compress or reduce the amplitude range of the signal appearing at the input of amplifier IC 101B.

The output of the op amp IC 101 B goes through two resistors R 169 and R 170 to ground. The signal between those resistors goes through a diode D 101 to the gate of FET Q 101. When the output of the op amp IC 101B exceeds a certain level the resistance for the FET goes up and cuts down the feedback of the op amp. Between the junction of resistors R 169 and R 170 and ground is a diode D 119 which serves to limit the amount of compressing that the FET can perform. When the output signal from the op amp increases, diode D 119 effectively reduces the resistance across resistor R 170. As soon as the signal gets above the threshold level of this diode D 119, the signal is passed to ground. Therefore, as the signal gets larger, the FET gate increases resistance until it gets to a certain point. At that point the signal level across the gate of the FET will not increase. If the op amp signal increases, the FET stops compressing at a certain point and intentionally lets the signal build up going through the op amp.

One reason why an upper limit is placed on the FET is related to the operating characteristics of the FET. As the signal increases at the gate of the FET, the resistance across it increases. At first the resistance goes up smoothly and relatively linearly. However, above a certain point the resistance goes up very quickly. This would reduce the gain of amp IC 101 B drastically until capacitor C 106, which charges up in response to signals, could discharge. A large signal across this capacitor would keep it charged and it would take a long time for the signal to bleed off. Therefore, if diode D 119 was not connected, a large signal could charge the capacitor keeping the FET at a high impedence, and one would not be able to hear weaker sounds played immediately after it. The discharge time of capacitor C 106 is set long enough to produce smooth decay of sounds in the guitar frequency range.

On a guitar the first sound or pulse that comes out can be a huge peak which is almost always much stronger than the signal which follows within a few milliseconds. A guitar amplifier tends to smooth out these sounds because it cannot respond to them fast enough, because it clips (distorts) large signals, and because the speakers have slow response. If the amplifier is turned up high it will simply distort the output amp or the speaker or both for those few milliseconds, and one will hear extra harmonics on the front of the note, without any large pulse coming through.

In accordance with the invention for louder notes, the signal is normally compressed, and the peaks are held to just below where the op amp is starting to clip. The signal immediately following is amplified up to this same point as capacitor C 106 discharges within about 50 milliseconds or less. Any extra signal will not be compressed since the diode D 119 prevents the signal at the FET from surpassing a certain limit.

Thus for overly large signals, the peak of the signal will cause distortion of the op amp TC 101 B, which is acceptable because distortion is a widely understood indicator that the input signal is too large, and the musician will likely reduce the volume of the instrument. Also, the clipping (distortion) of peaks is often accepted as normal for guitar amplifiers.

The above described arrangement not only results in obtaining sustain out of the guitar, it also eliminates large pulses at the front and keeps them down to a moderate level.

Compressor circuit 12 also includes a switchable high end EQ boost portion 12A comprising resistors R 109, R 110 and capacitor C 105. When switch SW 101 (the operation of which will be described in greater detail below) is in its second upper position, the high end EQ boost portion 12A is switched into the IC 101 B feedback loop, so that the high pass filter with a knee at about 2 KHz is added to the compressor circuit 12.

The high pass filter 13 comprises a resistor R 111 and capacitor C 107 and is connected in the circuit when the switch SW 101 is in the third and fourth positions. The filter is ineffective in the fourth position, however, due to the high input impedence of filter 15.

The mid band pass filter 14 comprises resistors R 112 and R 113 and capacitors C 108 and C 109. The mid band pass filter 14 receives its input from the output of the compressor circuit 12 and outputs a filtered signal which is fed to the input of distortion amp 16.

Distortion amp 16 comprises an integrated circuit IC 102A, and a feedback loop comprising diodes D 102 through D 105 and resistor R 114. The diodes serve to clip both the negative and positive going amplitudes of the output voltage to produce distortion when the input signal level is above a certain point. However below that certain point, the distortion amplifier 16 functions essentially as a linear amplifier. The output of distortion amplifier 16 is provided to a terminal of switch SW 101.

Switch SW 101 is a 10 terminal, four position slide switch having right and left slide members which are insulated from each other but which move together by a manual switching actuator. Each of the right and left slide members connect two adjacent terminals at a time. Thus, when the switch is in the extreme upper position, the upper two terminals on each side will be connected to each other. In the upper position, the controlled distortion portion of the preferred embodiment operates in the first mode (i.e. the middle chain with the mid band pass filter). In this position the output of the distortion amp 16 is connected to the input of the complex filter 17, and the EQ portion 12A of circuit 12 is not connected. When switch SW 101 is connected in the second uppermost position, the condition of the device is essentially the same as just described, except that the equalization portion 12A is connected in circuit with compressor section 12, so that the controlled distortion portion of the preferred embodiment operates in the second mode.

When switch SW 101 is in its third uppermost position, the output of high pass filter 13 is connected to the input of complex filter 17 so that the control distortion portion of the preferred embodiment operates in the third mode of operation. Also, the EQ portion 12A of compressor circuit 12 is not connected. When the switch SW 101 is in its lowermost position, the output of high pass filter 13 is connected to the input of low pass filter 15 and the control the fourth operational mode, and equalization portion 12A of compressor circuit 12 is not connected. Note that, as explained earlier, the high pass filter 13 does not substantially boost the high end in this mode.

Figure 3:
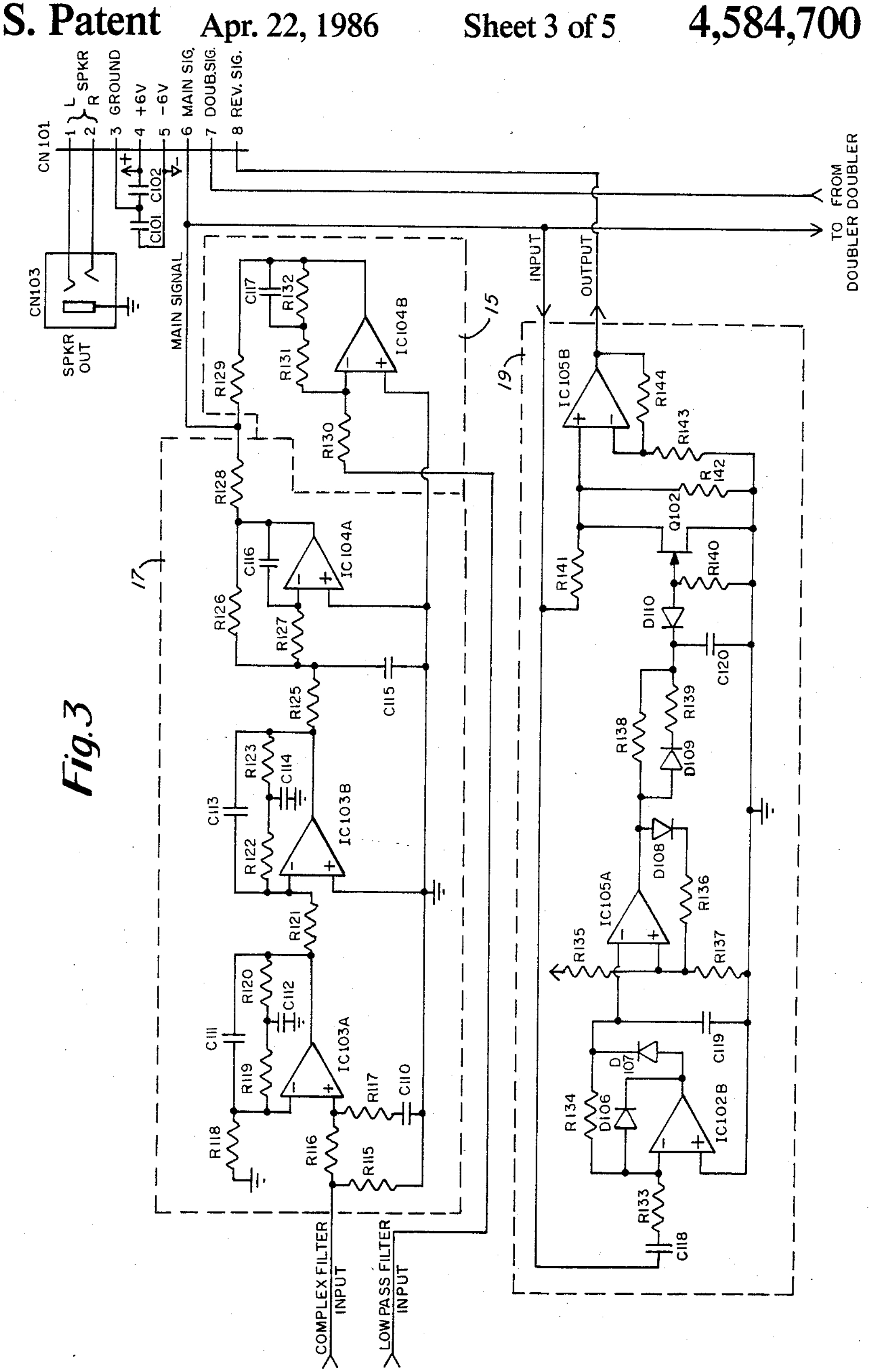
FIG. 3 is an electrical schematic diagram of some of the blocks of FIG. 1, including the low pass filter stage, the complex filter stage and the timed turn on gate for the reverberation device.
Figure 4:
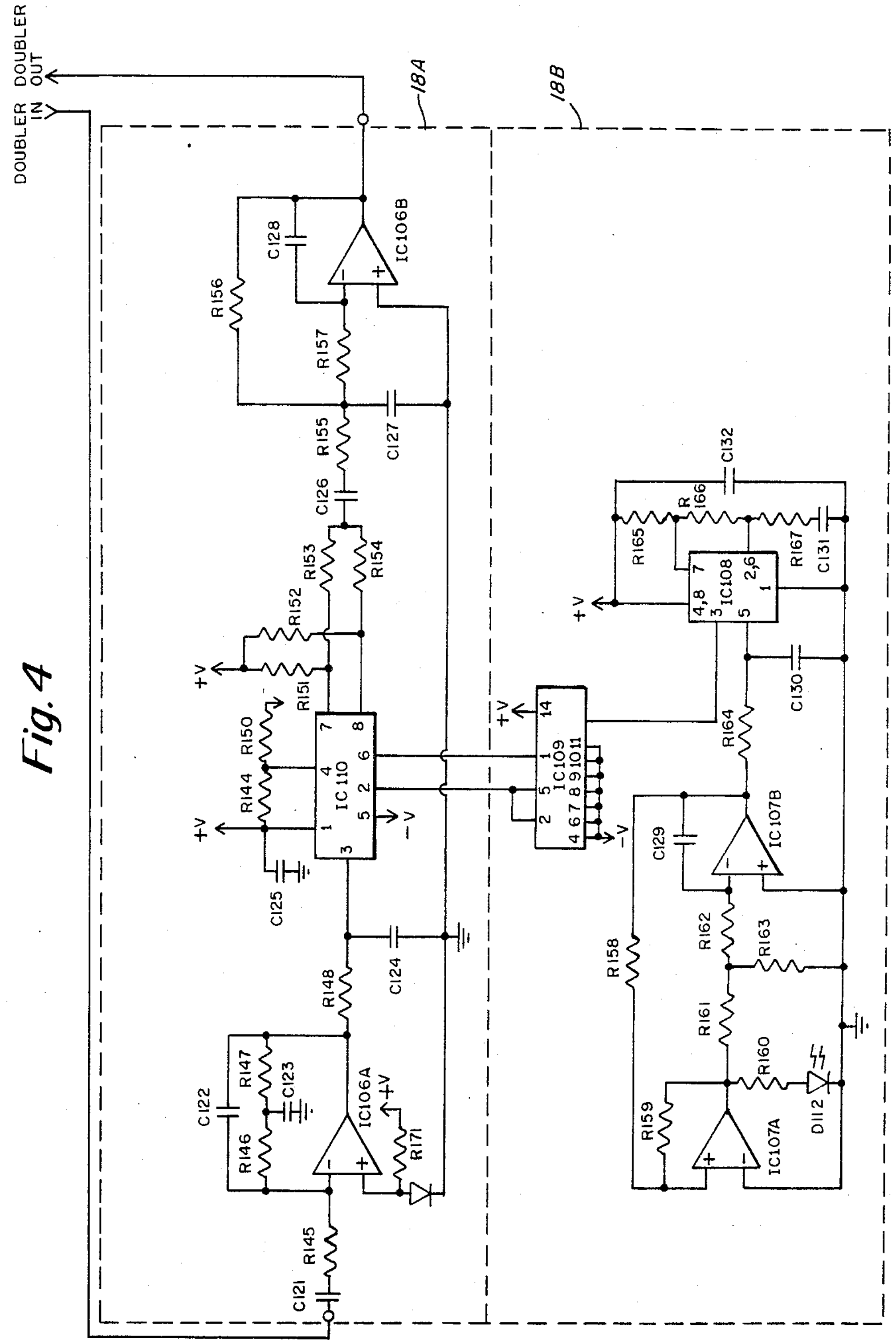
FIG. 4 is an electrical schematic diagram of the synthetic doubling circuit stage of FIG. 1.

Referring now to FIG. 3, the complex filter 17 comprises three substantially similar cascaded amplifier and filter stages having different value resistors and capacitors which define different frequency response characteristics for each of the stages and a passive filter stage providing a lower pass filter at the beginning. When cascaded together, the resultant frequency response is that shown in FIG. 1, i.e. a roll off of increased attenuation with increased frequency from 80 Hz to 250 Hz of about 4 db per octave, a decrease in attenuation with increased frequency to a peak at 500 Hz, followed by a dip at about 1.6 KHz and a peak at about 4 KHz, and a roll-off of increased attenuation with increased frequency of over 12 db per octave in the upper audio frequency range at frequencies above 4 KHz.

The low pass filter 15 as shown in FIG. 3 comprises an amplifier IC 104B, input resistor R 130 and a feedback loop comprising resistors R 131, R 132 and capacitor C 117. The frequency response of the low pass filter 15 is shown in FIG. 1 and has a generally flat response below 50 Hz, with increased attenuation with increased frequency between 50 Hz and 400 Hz, with a generally flat response above 400 Hz. As described above, low pass filter 15 is switched into the circuit when SW 101 is in the lowermost position, i.e. the fourth operational mode.

The portion of the preferred embodiment which is directed to reverberation comprises a doubling circuit 18, a timed turn on gate 19, an analog shift register bucket brigade device 20 with delay taps including its associated input buffer amp and filter circuit 20A, an output delay circuit 21, an output summing and amplifier circuit 22, and an output amplifier and mixing circuit 23. This portion of the preferred embodiment operates in one of three modes to provide doubling alone, reverb alone, or both doubling and reverb.

Turning now to FIG. 3, the operation of the timed turn on gate 19 will now be described. The timed turn on gate 19 receives a main audio signal which is fed into amplifier IC 102B. Amplifier IC 102B, in conjunction with amplifier IC 105A and associated resistors R 133 through R 140, capacitors C 118 through C 120 and diodes D 106 through D 110, will effect switching of FET transistor Q 102 (to gate the main audio signal to IC 105B) about 20 milliseconds after a main audio signal of sufficient magnitude is present on the main signal line. The main audio signal that is gated comes through resistor R 141.

When the input signal is low the resistance across the FET will be low and the signal will be attenuated to a very low amount, essentially off. When the signal to the FET is high, the FET will turn on and open its gate to let the main audio signal pass virtually unattenuated as long as a certain amount of voltage is maintained at the gate of the FET. The value of capacitor C 120, in conjunction with resistor R 138, determines the turn on time which is about 40 milliseconds. As soon as a signal of sufficient magnitude appears at the input of IC 102B, the signal at the output of IC 102B begins charging capacitor C 120. When C 120 is charged to a sufficient amount, the signal is passed to IC 105A. Therefore, adequate turn on voltage does not get to the FET gate for 40 milliseconds after the signal is present at the input of op amp IC 102B.

Capacitor C 120, in conjunction with R 139, sets the release time of the timed turn on gate which is a few milliseconds. Thus, if the signal voltage suddenly drops, the voltage across the capacitor C 120 will not disappear immediately, but will bleed off gradually through resistor R 139. Therefore, the FET will not clamp down shut suddenly but instead will slowly turn off so that the sound into the reverb does not end abruptly.

By providing a timed turn on gate some unwanted noise spikes of short duration (e.g. a few milliseconds), and most high amplitude peaks at the start of "stuccato" guitar notes, are eliminated. Without a timed turn on gate according to the invention, the spikes would pass to the main reverb unit and would result in numerous discrete echoes. One way to reduce the effect of spikes is to provide a large number of echo repeats, i.e. about 300 repeats per second. However, this would be quite costly. Therefore, by providing a timed turn on gate according to the invention, spikes will be eliminated even in reverb units having a small number of stages. If a note is played and then another note is played immediately thereafter, the reverb is already turned on so a spike would get through, but the spike would not be noticed because program material would mask it.

The doubling circuit 18 essentially functions to simulate a second instrument which is slightly off key and slightly out of time with an initial instrument. This is done by cyclicly varying the pitch of the initial instrument signal back and forth about its nominal pitch. For example, if the nominal pitch of the initial instrument signal is an F note then the doubler will output a sharp F note for a while and then a flat F note for a while followed by a sharp F note again and so on.

Cyclic pitch variation can be achieved by inputting the initial instrument signal into an analog delay device and then varying the clock frequency of the clock which drives the delay device. If the delay device is a bucket brigade, the bucket brigade receives an initial instrument signal and shifts the signal within the brigade from bucket to bucket at speed determined by the frequency of the clock which drives the bucket brigade. By varying the frequency of the clock signal the pitch of the signals passed by the buckets can be varied. By reducing the clock frequency the pitch will reduce. To hold the pitch at the reduced pitch level, one must keep reducing the clock speed at the same rate of change. However if this is continued the resultant delay of the bucket brigade will be delayed further and further until eventually the output would be minutes behind its input. In order to provide a pitch differential while still keeping the overall delay to about 15 to 20 milliseconds, the pitch is increased and then reduced and so on in a cyclical manner. Of course the delay will vary within the range of about 15 to 20 milliseconds.

The doubling circuit 18 comprises essentially two circuit portions: an analog delay portion 18A and a delay clock portion 18B.

The analog delay portion 18A comprises a bucket brigade device IC 110 which has an input buffer amp IC 106A, and an output buffer amp IC 106B, each having associated resistors and capacitors as shown. The bucket brigade IC 110 at its pins 2 and 6 receives a series of clock pulses of opposite phase from IC 109. IC 108 and 109 create a high frequency clock whose frequency varies about a nominal rate.

In order to create a slow variation in this clock rate, a low frequency oscillator comprising IC 107 A and B, along with associated resistors and capacitors, provides a triangle waveform signal of frequency about $0.5H_2$ to pin 3 of IC 109. In response to this triangle wave form, IC 108 and 109 will produce clock pulses of slowly varying frequency. The bucket brigade will respond to these clock pulses to cyclicly vary the pitch of its output signal to either side of the pitch of its input signal. The output of the doubling circuit will thus simulate a second instrument slightly off key and out of time with an instrument whose signal is inputted to the doubling circuit.

Figure 5:
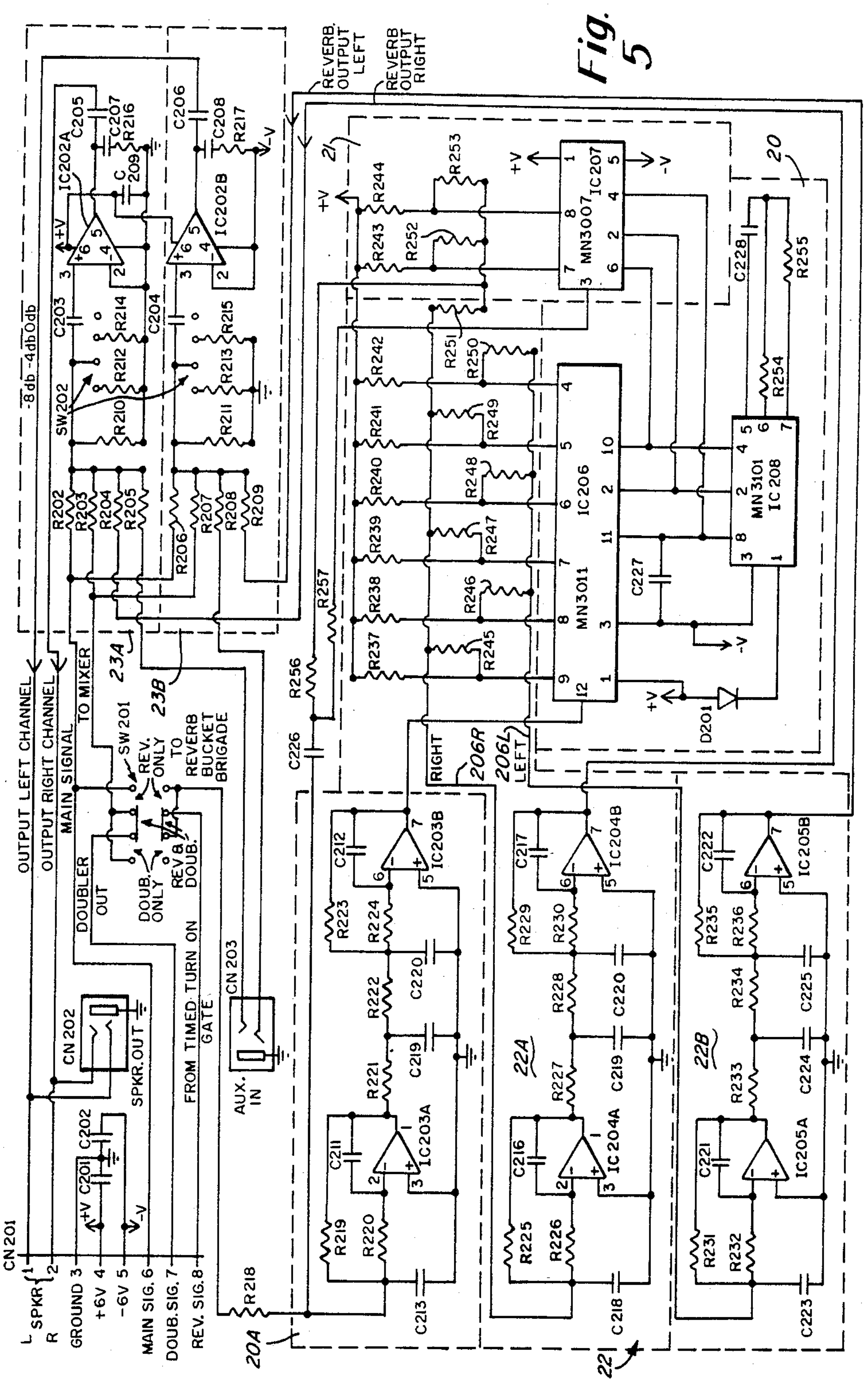
FIG. 5 is an electric schematic diagram of certain of the blocks of FIG. 1, including the bucket brigade stage, the delay output circuit, and the output amplifiers and mixers.

As shown in FIG. 5, the output from the timed turn on gate 19 and the doubling circuit 18 is provided to terminals of switch SW 201. Switch SW 201 is an eight terminal three position slide switch having an upper sliding member which engages two adjacent terminals at a time, and a lower sliding member which also engages two terminals at a time and moves in conjunction with the upper sliding member. The sliding members are moved by manual switch actuating element. When the switch actuator is on the extreme left, the reverberation portion of the preferred embodiment provides a doubling output but no reverb output to the output mixers. When the switch actuator is in the middle position, the reverberation portion of the preferred embodiment will provide both a doubling component and a reverberation component to the output mixers. When the switch actuator is on the extreme right, the reverberation portion of the circuit will provide a reverberation signal but no doubling component to the output mixers.

When switch SW 201 is in either the middle or extreme right position, the bucket brigade circuit 20 will receive a signal at the input of its buffer amplifier and filter circuit portion 20A. The buffer amplifier and filter circuit portion comprises two integrated circuits IC 203A and IC 203B, and associated resistors and capacitors, and provides an amplified and filtered signal to pin 12 of the bucket brigade device IC 206. The integrated circuit IC 206 is an analog shift register having 6 output delay taps at pins 4–9 thereof.

Integrated circuit IC 208 is an analog shift register clock generator/driver which drives both integrated circuits IC 206 and IC 207. The period of the switching of the timer is dependent upon the circuit values of resistors R 254, R 255 and capacitor C 228. The bucket brigade IC 206 receives an input signal at pin 12 and provides this signal at different delay periods to the output delay taps (pins 4–9). The delay between adjacent delay taps is about 15 to 40 milliseconds, so that the input signal is outputted at the first delay tap (pin 9) about 25 milliseconds after it is received at pin 12. The signal is outputted at the last delay tap (pin 4) about 150 milliseconds after it is received at input pin 12 of IC 206. The output of the last delay tap (pin 4) is provided to pin 3 of an additional output delay integrated circuit chip IC 207, which is also an analog shift register like IC 206, but with fewer stages. The IC 207, at pins 7 and 8, provides a delayed output about 50 milliseconds after it receives an input at pin 3.

The output of output delay taps 4–9 of bucket brigade IC 206 and delay taps 7 and 8 of IC 207 are fed into a resistor summing network comprising resistors R 245 through R 251. As seen from the Figure, the outputs of alternate pins 4, 6 and 8 are summed on the lower output line (left channel), whereas the outputs of alternate pins 5, 7 and 9 are summed on the upper output line (right channel). Further, the output of the additional output delay chip IC 207 is fed to the upper output line only. The output of the upper output line (right channel) is fed to the input of a right output amplifier and filter comprising integrated circuits IC 204A and IC 204B, associated resistors R 225 through R 230, and capacitors C 216 through C 220. The output of this right output amplifier and filter appearing at pin 7 of IC 204B is connected to a resistor R 204 at the input of output amplifier and mixing circuit 23.

Similarly, the output of the lower line of summing resistors (left channel) is fed to the left output amplifier and filter circuit comprising IC 205A and IC 205B, associated resistors R 231 through R 236, and capacitors C 221 through C 225. The output of the left output amplifier and filter circuit appears at pin 7 of IC 205B and is connected to resistor R 209 at the input of output amplifier and mixing circuit 23.

The output amplifier and mixing circuit 23 comprises essentially two different, but substantially identical, output amplifier and mixing circuits 23A and 23B. The upper output amplifier and mixing circuit 23A comprises four input summing resistors R 202 through R 205 and an amplifier mixer IC 202A. In like manner, the lower output amplifier and mixing circuit 23B comprises four input summing resistors R 206 through R 209 and an amplifier mixer IC 202B.

The main signal from the controlled distortion and tone alteration portion of the circuit always appears at the left side of input summing resistors R 202 and R 206. When switch SW 201 is in the middle or right position, reverberation signals will appear at the left side of input summing resistors R 204 and R 209. A doubling signal will appear at the left side of input summing resistors R 203 and R 207 when switch SW 201 is in either the left or middle position, but not when SW 201 is in the right position. However, when SW 201 is in the right position, the main audio signal will appear at the left side of resistors R 203 and R 207 in place of the doubling signal to compensate for the absence of the doubling signal. In this way, the combined signal level of the main audio and doubling signals to each mixer is maintained relatively constant. An auxiliary input signal can be inputted to connector CN 203 if desired and will then appear at the right side of input summing resistors R 205 and R 208. The summing resistors R 202, R 206, R 203, and R 207 are chosen so that the main signal will appear to be substantially, but not entirely at one side of the stereo mix and the doubling signal will appear to be substantially, but not entirely, at the other side when switch SW 201 is in the left or middle position. This is important in order to achieve some phase cancellation between the signals and at the same time provide stereo separation between the main signal and the artificial doubled signal.

Switch SW 202 in the output amplifier and mixing circuit 23 provides a means to selectively attenuate the mixed signals in both channels before they pass through amplifiers IC 202A and IC 202B. Switch SW 202 is a three position, eight terminal slide switch substantially identical in structure and operation to switch SW 201. When the switch contacts are in the extreme right position, 0 db attenuation is achieved. When the switch is in the middle position, 5 db attenuation is obtained, and when the switch is in the left position 10 db of attenuation is achieved.

The output of output amplifier and mixing circuit 23 provides two separate channels of output signals having different signal characteristics. The signals are provided to connector CN 202 which is a stereo output connector, and to terminals 1 and 2 of connector CN 201, also a stereo output connector. The signals from these two separate channels can be provided to a sound transducer, a stereo amplifier and speaker system, a mixing console or sound recording device.

Table 1 attached hereto lists the values of the circuit components described herein. However, it is to be understood that the invention is not limited to the precise circuit values or even the specific embodiment described above, and no limitation with respect to the specific apparatus illustrated herein is intended or should be inferred. It can be appreciated that numerous variations and modifications may be effected without departing from the true spirit and scope of the novel concept of the invention. It is of course intended to cover by the appended claims all such modifications as fall within the scope of the claims.

TABLE I

| | | | |
|---|---|---|---|
| R 101 | 10K | R 131 | 100K |
| R 102 | 5.6K | R 132 | 560K |
| R 103 | 18K | R 133 | 1 M |
| R 104 | 180K | R 134 | 1 M |
| R 105 | 12K | R 135 | 1 M |
| R 106 | 22 M | R 136 | 1 M |
| R 109 | 1K | R 137 | 4.7K |
| R 110 | 10K | R 138 | 1 M |
| R 111 | 18K | R 139 | 150K |
| R 112 | 3.3K | R 140 | 10 M |
| R 113 | 33K | R 141 | 120K |
| R 114 | 1 M | R 142 | 10K |
| R 115 | 2.7K | R 143 | 10K |
| R 116 | 82K | R 144 | 68K |
| R 117 | 8.2K | R 145 | 150K |
| R 118 | 100K | R 146 | 82K |
| R 119 | 100K | R 147 | 82K |
| R 120 | 100K | R 148 | 6.8K |
| R 121 | 47K | R 149 | 22K |
| R 122 | 100K | R 150 | 2.2K |
| R 123 | 100K | R 151 | 100K |
| R 125 | 13K | R 152 | 100K |
| R 126 | 13K | R 153 | 4.7K |
| R 127 | 3.9K | R 154 | 4.7K |
| R 128 | 2.2K | R 155 | 47K |
| R 129 | 2.2K | R 156 | 47K |
| R 130 | 120K | R 157 | 22K |
| R 158 | 27K | R 217 | 10Ω |
| R 159 | 39K | R 218 | 100K |
| R 160 | 220Ω | R 219 | 100K |
| R 161 | 120K | R 220 | 33K |
| R 162 | 220K | R 221 | 47K |
| R 163 | 6.8K | R 222 | 56K |
| R 164 | 330K | R 223 | 100K |
| R 165 | 2.7K | R 224 | 33K |
| R 166 | 560K | R 225 | 100K |
| R 168 | 10K | R 226 | 33K |
| R 169 | 390Ω | R 227 | 47K |
| | | R 228 | 56K |
| R 171 | 10K | R 229 | 100K |
| R 202 | 120K | R 230 | 33K |
| R 203 | 39K | R 231 | 100K |
| R 204 | 220K | R 232 | 33K |
| R 205 | 33K | R 233 | 47K |
| R 206 | 39K | R 234 | 56K |
| R 207 | 120K | R 235 | 100K |
| R 208 | 33K | R 236 | 33K |
| R 209 | 180K | R 237 | 56K |
| R 210 | 2.2K | R 238 | 56K |
| R 211 | 2.2K | R 239 | 56K |
| R 212 | 1K | R 240 | 56K |
| R 213 | 1K | R 241 | 56K |
| R 214 | 2.7K | R 242 | 56K |
| R 215 | 2.7K | R 243 | 100K |
| R 216 | 10Ω | R 244 | 100K |
| R 245 | 100K | C 116 | .001 uf |
| R 246 | 100K | C 117 | .005 uf |
| R 247 | 120K | C 118 | .01 uf |
| R 248 | 120K | C 119 | .05 uf |
| R 249 | 150K | C 120 | .05 uf |
| R 250 | 150K | C 121 | 3.3 uf |
| R 251 | 150K | C 122 | 62 pf |
| R 252 | 5.6K | C 123 | 1500 pf |
| R 253 | 5.6K | C 124 | 2700 pf |
| R 254 | 120K | C 125 | 22 uf |
| R 255 | 22K | C 126 | 3.3 uf |
| R 256 | 470K | C 127 | .0033 uf |
| R 257 | 390K | C 128 | .001 uf |
| | | C 129 | .15 uf |
| C 102 | 22 uf | C 130 | .01 uf |
| C 103 | .001 uf | C 131 | 15 pf |
| C 104 | 3.3 uf | C 132 | 3.3 uf |
| C 105 | .1 uf | C 201 | 220 uf |
| C 106 | .082 uf | C 202 | 220 uf |
| C 107 | .01 uf | C 203 | .1 uf |
| C 108 | .033 uf | C 204 | .1 uf |
| C 109 | .01 uf | C 205 | 220 uf |
| C 110 | .033 uf | C 206 | 220 uf |

TABLE I-continued

| | | | |
|---|---|---|---|
| C 111 | .001 uf | C 207 | .05 uf |
| C 112 | .0082 uf | C 208 | .05 uf |
| C 113 | 82 pf | C 209 | .1 uf |
| C 114 | .0015 uf | C 211 | 220 pf |
| C 115 | .047 uf | C 212 | 220 pf |
| C 214 | 2700 pf | D 101-D 111 | IN 914 |
| C 215 | 2700 pf | D 112 | LED |
| C 216 | 220 pf | D 113 | LED ($V_B = 2.2$) |
| C 217 | 220 pf | D 201 | IN 914 |
| C 218 | 2700 pf | Q 101 | 2N 4340 FET |
| C 219 | 2700 pf | Q 102 | 5457 FET |
| C 220 | 2700 pf | IC 105 | TL 072 |
| C 221 | 220 pf | IC 106 | TL 072 |
| C 222 | 220 pf | IC 107 | TL 072 |
| C 223 | 2700 pf | IC 108 | IC 7555 |
| C 224 | 2700 pf | IC 109 | CD 4013B |
| C 225 | 2700 pf | IC 110 | MN 3007 |
| C 226 | 3.3 uf | IC 201 | LM 386 |
| C 227 | 3.3 uf | IC 202 | LM 386 |
| | | IC 203 | TL 072 |
| C 228 | 220 pf | IC 204 | TL 072 |
| IC 101 | TL 072 | IC 205 | TL 072 |
| IC 102 | TL 072 | IC 206 | MN 3011 |
| IC 103 | TL 072 | IC 207 | MN 3007 |
| IC 104 | TL 072 | IC 208 | MN 3101 |
| | | VR 101 | EVM-31G |

What is claimed is:

1. An electronic audio signal processor for processing signals in the audio frequency range, comprising:
   - a mid band pass filter having an input and output and having a bandpass in the middle audio frequency range for receiving an audio input signal;
   - a distortion amplifier having an input and output and connected to receive the output of said mid bandpass filter for adding harmonic audio signals to said received signal;
   - a complex filter connected to receive the output of said distortion amplifier, said complex filter having a low audio frequency range, a mid audio frequency range including lower and upper portions thereof, and an upper audio frequency range, said complex filter having a roll-off of increased attenuation with increased frequency in the low audio frequency range, a generally flat response in the mid audio frequency range, but having a dip followed by a peak in the upper frequency portion of said mid audio frequency range, and a roll-off of increased attenuation with increased frequency in the upper audio frequency range.
2. The electronic audio signal processor according to claim 1 further including:
   - an audio signal compressor circuit before said mid bandpass filter for receiving the audio input signal and for providing the mid bandpass filter with a signal having reduced amplitude variation relative to variations in the input signal amplitude.
3. The electronic audio signal processor according to claim 2 further including:
   - a high pass audio boost stage connected in circuit with said compressor circuit.
4. The electronic audio signal processor according to claim 2 further including:
   - a high pass audio filtering circuit before said compressor circuit for receiving the audio input signal and for providing the compressor circuit with a filtered signal having a decreased low and mid range audio signal content.

5. The electronic audio signal processor according to claim 1 wherein said dip is at a frequency on the order of 1.6 KHz and said peak is at a frequency on the order of 4 KHz.

6. An electronic audio signal processor for processing signals in the audio frequency range, comprising:

a high pass audio filtering circuit for receiving an electrical audio input signal and having an input and output;

an audio signal compressor circuit for receiving the output of said high pass audio filter and for producing an output signal having reduced amplitude variation relative to the variation in the amplitude of the input signal, a complex filter connected to receive the output of said compressor circuit, said complex filter having a low audio frequency range, a mid audio frequency range, and an upper audio frequency range, said complex filter having a roll-off of increased attenuation with increased frequency in the low audio frequency range, a generally flat response in the mid audio frequency range, and a roll-off of increased attenuation with increased frequency in the upper audio frequency range, a distortion amplifier connected between said compressor circuit and complex filter for providing to said complex filter, a signal having a harmonic audio signal content increased relative to the harmonic signal content from said compressor circuit, and a switch means associated with said highpass audio filtering circuit, said switch means having at least two positions including a first position in which the roll-off of the filter is at a first frequency and a second position in which the roll-off is at a second frequency higher than said first frequency.

7. The electronic audio signal processor according to claim 6 wherein the complex filter has in its mid audio frequency range, a dip followed by a peak in the upper frequency portion of the mid audio frequency range.

8. The electronic audio signal processor according to claim 6 further including:

a mid band pass audio filter connected between said compressor circuit and said distortion amplifier.

9. The electronic audio signal processor according to claim 6 further including:

an input buffer amplifier connected in front of said high pass audio filtering circuit for receiving the audio input signal and for providing the high pass filtering circuit with an amplified audio signal.

10. An electronic audio signal processor for processing signals in the audio frequency range, comprising:

a high pass audio filtering circuit for receiving an electric audio input signal and having an input and output;

an audio signal compressor circuit for receiving the output of said high pass audio filter and for producing an output signal having reduced amplitude variation relative to the variation in the amplitude of the input signal, a complex filter connected to receive the output of said compressor circuit, said complex filter having a roll-off of increased attenuation with increased frequency in the low audio frequency range, a generally flat response in the mid audio frequency range, but having a dip followed by a peak in the upper frequency portion of said mid audio frequency range, and a roll-off of increased attenuation with increased frequency in the upper audio frequency range, a second high pass audio filtering circuit connected between said compressor circuit and complex filter for providing the complex filter with a signal having increased high audio signal content relative to the low and mid audio signal content of the signal received from the compressor circuit.

11. An electronic audio signal processor for processing signals in the audio frequency range, comprising:

a high pass audio filtering circuit for receiving an electrical audio input signal and having an input and output;

an audio signal compressor circuit for receiving the output of said high pass audio filter and for producing an output signal having reduced amplitude variation relative to the variation in the amplitude of the input signal; and a complex filter connected to receive the output of said distortion amplifier, said complex filter having a low audio frequency range, a mid audio frequency range including lower and upper portions thereof, and an upper audio frequency range, said complex filter having a roll-off of increased attenuation with increased frequency in the low audio frequency range, a generally flat response in the mid audio frequency range, but having a dip followed by a peak in the upper frequency portion of said mid audio frequency range, and a roll-off of increased attenuation with increased frequency in the upper audio frequency range.

12. An electronic audio signal processor processing signals in the audio frequency range, comprising:

an audio signal compressor circuit for receiving an electrical audio input signal and for producing an output signal having decreased variation in amplitude relative to the variations in the input signal amplitude;

a distortion amplifier connected to receive the output of said compressor circuit for adding audio harmonic signals to said received signal, a mid band audio filter connected between said compressor circut and said distortion amplifier, and a complex filter connected after said distortion amplifier, said complex filter having a roll-off of increased attenuation with increased frequency in the low audio frequency range, a generally flat response in the mid audio frequency range, but having a dip followed by a peak in the upper frequency portion of said mid audio frequency range, and a roll-off of increased attenuation with increased frequency in the upper audio frequency range, said mid band pass audio filter having a pass band extending through a range starting at about 250 Hz to 800 Hz and ending at about 2 KHz to 5 KHz.

13. The electronic audio signal processor according to claim 12 further including:

a high pass audio filtering circuit before said compressor circuit for receiving the audio input signal and for providing the compressor circuit with a filtered signal having a decreased low and mid range audio signal content.

14. The electronic audio signal processor according to claim 13 further including:

an input buffer amplifier connected in front of said high pass audio filtering circuit for receiving the audio input signal and for providing the high pass filtering circuit with an amplified audio signal.

15. An electronic audio signal processor for processing signals in the audio frequency range, comprising:

a first high pass audio filtering circuit for receiving an electrical audio input signal and having an output;

an audio signal compressor circuit for receiving an electrical audio signal output from said first high pass audio filter and for producing an output signal having decreased variation in amplitude relative to the variations in the input signal amplitude;

a second high pass filter coupled to the output of said compressor circuit, a low pass filter, a first switch means associated with said first high pass audio filtering circuit, said first switch means having at least two positions including a first position in which the roll-off of the first high pass audio filter is at a first frequency and a second position in which the roll-off is at a second frequency higher than said first frequency;

and a second switch means which selectively couples an output of the second high pass filter to an input of the low pass filter.

16. An electronic audio signal processor for processing signals in the audio frequency range comprising;

an audio signal compressor circuit for receiving an electrical audio input signal for producing an output signal, a complex filter connected to receive the output of said compressor circuit, a mid band pass audio filter having an input and output, manual switch means having multiple positions including a first circuit interconnecting position in which the compressor circuit, the mid band pass audio filter and the complex filter are interconnected in series, and a high pass equalization circuit, said switch means having a second circuit interconnecting positions in which the equalization circuit is connected with the compressor circuit while maintaining the mid band pass audio filter coupled between the compressor circuit and complex filter.

17. An electronic audio signal processor according to claim 16 further including a high pass audio filtering circuit, said switch means having a third circuit interconnecting position in which the high pass audio filtering circuit is inntercoupled between the compressor circuit and complex filter.

18. An electronic audio signal processor according to claim 17 further including a low pass audio filtering circuit, said switch means having a fourth circuit interconnecting position in which the output of the high pass audio filtering circuit is coupled to the input of the low pass audio filtering circuit.

19. An electronic audio signal processor according to claim 18 wherein said switch means is a manual slide switch having four positions in which adjacent terminals are successively interconnected.

20. An electronic audio signal processor for processing signals in the audio frequency range comprising;

an audio signal compressor circuit for receiving an electrical audio input signal for producing an output signal, a complex filter connected to receive the output of said compressor circuit, a mid band audio filter having an input and output, manual switch means having multiple positions including a first circuit interconnecting position in which the compressor circuit, the mid band pass audio filter and the complex filter are interconnected in series, and a distortion amplifier connected to receive the output of said compressor circuit via the mid band pass audio filter for adding audio harmonic signals to said received signal.

21. An electronic audio signal processor for processing signals in the audio frequency range comprising;

an audio signal compressor circuit for receiving an electrical audio input signal for producing an output signal, a complex filter connected to receive the output of said compressor circuit, a mid band pass audio filter having an input and output, and manual switch means having multiple positions including a first circuit interconnecting position in which the compressor circuit, the mid band pass audio filter and the complex filter are interconnected in series, wherein said complex filter has a roll-off of increased attenuation with increased frequency in the low audio frequency range, a generally flat response in the mid audio frequency range but having a dip followed by a peak in the upper frequency portion of said mid audio frequency range, and a roll-off of increased attenuation with increased frequency in the upper audio frequency range.

* * * * *